(12) United States Patent
Hasegawa et al.

(10) Patent No.: US 8,858,877 B2
(45) Date of Patent: Oct. 14, 2014

(54) SPUTTERING TARGET MATERIAL

(71) Applicant: Ishifuku Metal Industry Co., Ltd., Tokyo (JP)

(72) Inventors: Koichi Hasegawa, Soka (JP); Nobuo Ishii, Soka (JP)

(73) Assignee: Ishifuku Metal Industry Co., Ltd., Tokyo (JP)

( * ) Notice: Subject to any disclaimer, the term of this patent is extended or adjusted under 35 U.S.C. 154(b) by 0 days.

(21) Appl. No.: 13/692,256

(22) Filed: Dec. 3, 2012

(65) Prior Publication Data

US 2013/0094990 A1    Apr. 18, 2013

Related U.S. Application Data

(62) Division of application No. 13/305,963, filed on Nov. 29, 2011, which is a division of application No. 13/102,209, filed on May 6, 2011, now Pat. No. 8,252,127, which is a division of application No. 10/575,725, filed as application No. PCT/JP2004/015294 on Oct. 8, 2004, now Pat. No. 7,959,746.

(30) Foreign Application Priority Data

Oct. 16, 2003 (JP) .................. 2003-356769

(51) Int. Cl.
C22C 5/06 (2006.01)
(52) U.S. Cl.
USPC .......................... 420/501; 420/502
(58) Field of Classification Search
USPC .................. 420/501–506; 148/430
See application file for complete search history.

(56) References Cited

U.S. PATENT DOCUMENTS

| | | | |
|---|---|---|---|
| 2,310,231 A * | 2/1943 | Goldsmith | 420/504 |
| 2,450,340 A * | 9/1948 | Hensel et al. | 420/505 |
| 2,719,085 A * | 9/1955 | Schatz | 420/502 |
| 5,338,646 A * | 8/1994 | Nakayama et al. | 430/270.11 |
| 6,841,012 B2 * | 1/2005 | Croce | 148/430 |

FOREIGN PATENT DOCUMENTS

| | | | |
|---|---|---|---|
| DE | 730894 | * | 1/1943 |
| EP | 0 849 727 | | 6/1998 |
| EP | 0849727 A2 | * | 6/1998 |
| JP | 59-86218 | | 5/1984 |
| JP | 59086218 A | * | 5/1984 |
| JP | 61-133350 | | 6/1986 |
| JP | 61133350 A | * | 6/1986 |
| JP | 62-112742 | | 5/1987 |
| JP | 62112742 A | * | 5/1987 |
| JP | 63013690 A | * | 1/1988 |
| JP | 4-358032 | | 12/1992 |
| JP | 04358032 A | * | 12/1992 |
| JP | 09324264 A | * | 12/1997 |
| JP | 2002-319185 | | 10/2002 |
| JP | 2002-319185 A | * | 10/2002 |
| JP | 2004-192702 | | 7/2004 |
| JP | 2004192702 A | * | 7/2004 |
| JP | 2004-263290 | | 9/2004 |
| JP | 2004263290 A | * | 9/2004 |
| JP | 2004-331990 | | 11/2004 |
| JP | 2004331990 A | * | 11/2004 |

OTHER PUBLICATIONS

International search report issued Dec. 14, 2004 in International (PCT) Application No. PCT/JP2004/015294.*
"ASM Handbooks Online", vol. 5 Surface Engineering, http://products.asminternational.org/hbk/index.jsp, 2002.*
Supplementary European Search Report issued Aug. 8, 2008 in connection with European Application No. 04 79 2511.0.*

* cited by examiner

*Primary Examiner* — Roy King
*Assistant Examiner* — Janelle Morillo
(74) *Attorney, Agent, or Firm* — Wenderoth, Lind & Ponack, L.L.P.

(57) ABSTRACT

This invention provides sputtering target materials having high reflectance and excellent heat resistance, which are formed of Ag base alloys formed by adding a specific, minor amount of P to Ag and alloying them.

2 Claims, No Drawings

SPUTTERING TARGET MATERIAL

This application is a DIV of Ser. No. 13/305,963 filed Nov. 29, 2011, which is a DIV of U.S. Pat. No. 8,252,127 filed May 6, 2011, which is a DIV of U.S. Pat. No. 7,959,746 filed Apr. 13, 2006, which is a 371 of PCT/JP2004/015294 filed Oct. 8, 2004.

TECHNICAL FIELD

This invention relates to thin film-forming sputtering target material having improved heat resistance while retaining high reflectance, and to the thin film which is formed with use of the sputtering target material.

BACKGROUND ART

For reflection film or coating used on optical recording media such as CD (Compact Disc), DVD (Digital Versatile Disc), and the like or photo-reflective conductive coating used on reflection type STN (Super Twist Nematic) liquid crystal display devices, organic EL (Electroluminescence) display devices and the like, generally aluminum (Al) or Al alloys are used.

Such photoreflective thin film put to usages with those optical recording media, liquid crystal display devices, organic EL display devices and the like is generally prepared by making sputtering target material having desired properties, and film-forming using the sputtering target material by such methods as RF (radiofrequency) sputtering or DC (direct current) sputtering.

Thin films formed of Al or Al alloys which are prepared by such methods exhibit moderate degrees of reflectance, low electrical resistance and furthermore, stable corrosion resistance even in the air because passive state films are formed in the surface layers. However, reflectance of thin film made of Al or an Al alloy is, for example, around 80% of light having a wavelength of 700 nm, which is not fully satisfactory for the usages requiring high reflectance.

It has been hence proposed to form thin films using gold (Au) or silver (Ag) as sputtering target material instead of Al or Al alloys, for e.g., optical disc media represented by CD or DVD which require high reflectance. Also for reflection type STN liquid crystal display devices, use of Ag having high reflectance as the material for the thin film has been proposed.

Optical disc media represented by CD or DVD, reflection type STN liquid crystal display devices and the like are liable to be exposed to high temperatures under the conditions of their use. Where Ag is used, there arises a problem that the film may cause aggregation under high temperatures, e.g., 200° C. or higher, to decrease the reflectance.

DISCLOSURE OF THE INVENTION

A main object of the present invention is to provide thin film-forming sputtering target material formed of Ag-base alloy, which exhibits improved heat resistance, while retaining high reflectance.

We have engaged in extensive research work with the view to achieve the above object, to come to discover that an Ag base alloy exhibiting drastically improved heat resistance while retaining the high reflectance characteristic of Ag can be obtained when a specific minor amount of phosphorus (P) is added and alloyed together; that an Ag base alloy exhibiting improved corrosion resistance as well as heat resistance can be obtained when each a minor amount of metallic element(s) such as In, Sn, Zn, Au, Pt, Pd and the like is (are) added to Ag, in addition to the specific minor amount of P, and alloyed together; and that heat resistance of the Ag base alloy can be further improved when each a minor amount of such metallic element(s) as Cu, Ni, Fe, Bi and the like is (are) added to Ag, in addition to the specific minor amount of P, and alloyed together. The present invention is whereupon completed.

Thus the present invention provides a thin film-forming sputtering target material having high reflectance, characterized by being made of an Ag base alloy containing 0.005-1.0 mass % of P.

The invention also provides a thin film-forming sputtering target material having high reflectance, characterized by being made of an Ag base alloy containing 0.005-1.0 mass % of P and 0.01-2.0 mass % of at least one metallic element selected from In, Sn and Zn.

The invention furthermore provides a thin film-forming sputtering target material having high reflectance, characterized by being made of an Ag base alloy containing 0.005-1.0 mass % of P, 0.01-0.9 mass % of Au and/or 0.01-5.0 mass % of Pd and/or 0.01-0.9 mass % of Pt.

The invention furthermore provides a thin film-forming sputtering target material having high reflectance, characterized by being made of an Ag base alloy containing 0.005-1.0 mass % of P and 0.01-5.0 mass % of at least one metallic element selected from Cu, Ni, Fe and Bi.

The invention also provides a thin film-forming sputtering target material having high reflectance, characterized by being made of an Ag base alloy containing 0.005-1.0 mass % of P, 0.01-2.0 mass % of at least one metallic element selected from In, Sn and Zn, 0.01-0.9 mass % of Au and/or 0.01-5.0 mass % of Pd and/or 0.01-0.9 mass % of Pt.

The invention also provides a thin film-forming sputtering target material having high reflectance, characterized by being made of an Ag base alloy containing 0.005-1.0 mass % of P, 0.01-2.0 mass % of at least one metallic element selected from In, Sn and Zn, and 0.01-5.0 mass % of at least one metallic element selected from Cu, Ni, Fe and Bi.

The invention also provides a thin film-forming sputtering target material having high reflectance, characterized by being made of an Ag base alloy containing 0.005-1.0 mass % of P, 0.01-0.9 mass % of Au and/or 0.01-5.0 mass % of Pd and/or 0.01-0.9 mass % of Pt, and 0.01-5.0 mass % of at least one metallic element selected from Cu, Ni, Fe and Bi.

The invention also provides a thin film-forming sputtering target material having high reflectance, characterized by being made of an Ag base alloy containing 0.005-1.0 mass % of P, 0.01-2.0 mass % of at least one metallic element selected from In, Sn and Zn, 0.01-0.9 mass % of Au and/or 0.01-5.0 mass % of Pd and/or 0.01-0.9 mass % of Pt, and 0.01-5.0 mass % of at least one metallic element selected from Cu, Ni, Fe and Bi.

Hereinafter the thin film-forming sputtering target materials according to the invention are explained in further details.

The sputtering target materials of the invention are fundamentally composed of an Ag base alloy made by adding P to Ag as the base and alloying them. The use rate of P ranges 0.005-1.0 mass %, preferably 0.01-0.75 mass %, in particular, 0.05-0.5 mass %.

A sputtering target material of the invention may be composed of ternary Ag base alloy formed by adding, to above Ag—P binary alloy components, at least one metallic element selected from In, Sn and Zn (hereafter referred to as "(a) group metallic elements") and alloying them. The addition ratio of the (a) group metallic element(s) can be each within a range of 0.01-2.0 mass %, preferably 0.05-1.75 mass %, in particular, 0.1-1.5 mass %.

A sputtering target material of the invention may be composed of a ternary Ag base alloy formed by adding, to above Ag—P binary alloy components, at least one metallic element selected from Au, Pd and Pt (hereafter referred to as "(b) group metallic elements") and alloying them. The amount of the (b) group metallic element to be added is; for Au, within a range of 0.01-0.9 mass %, preferably 0.05-0.85 mass %, in particular, 0.1-0.8 mass %; for Pd, 0.01-5.0 mass %, preferably 0.05-3.5 mass %, in particular, 0.1-2.0 mass %; and for Pt, 0.01-0.9 mass %, preferably 0.05-0.85 mass %, in particular, 0.1-0.8 mass %.

A sputtering target material of the invention may also be composed of a ternary Ag base alloy formed by adding, to the above Ag—P binary alloy components, at least one metallic element selected from Cu, Ni, Fe and Bi (hereafter referred to as "(c) group metallic elements") and alloying them. The amount of the (c) group metallic element(s) to be added can be each within a range of 0.01-5.0 mass %, preferably 0.05-3.5 mass %, in particular, 0.1-2.0 mass %.

A sputtering target material of the invention may also be composed of a quaternary Ag base alloy formed by adding, to the Ag—P binary alloy components, (a) group metallic element(s) and (b) group metallic element(s) and alloying them. In such a quaternary Ag base alloy, addition ratio of the (a) group metallic element(s) may be each within a range of 0.01-2.0 mass %, preferably 0.05-1.75 mass %, in particular, 0.1-1.5 mass %; and that of the (b) group metallic element(s) may be within a range of: for Au, 0.01-0.9 mass %, preferably 0.05-0.85 mass %, in particular, 0.1-0.8 mass %; for Pd, 0.01-5.0 mass %, preferably 0.05-3.5 mass %, in particular, 0.1-2.0 mass %; and for Pt, 0.01-0.9 mass %, preferably 0.05-0.85 mass %, in particular, 0.1-0.8 mass %.

A sputtering target material of the invention may also be composed of a quaternary Ag base alloy formed by adding, to the Ag—P binary alloy components, (a) group metallic element(s) and (c) group metallic element(s) and alloying them. In this quaternary Ag base alloy, addition ratio of (a) group metallic element(s) may be each within a range of 0.01-2.0 mass %, preferably 0.05-1.75 mass %, in particular, 0.1-1.5 mass %; and that of (c) group metallic element(s) may be each within a range of 0.01-5.0 mass %, preferably 0.05-3.5 mass %, in particular, 0.1-2.0 mass %.

A sputtering target material of the invention may also be composed of a quaternary Ag base alloy formed by adding, to the Ag—P binary alloy components, (b) group metallic element(s) and (c) group metallic element(s) and alloying them. In this quaternary Ag base alloy, addition ratio of (b) group metallic element(s) may be within a range of: for Au, 0.01-0.9 mass %, preferably 0.05-0.85 mass %, in particular, 0.1-0.8 mass %; for Pd, 0.01-5.0 mass %, preferably 0.05-3.5 mass %, in particular, 0.1-2.0 mass %; and for Pt, 0.01-0.9 mass %, preferably 0.05-0.85 mass %, in particular, 0.1-0.8 mass %; and that of (c) group metallic element(s) may be each within a range of 0.01-5.0 mass %, preferably 0.05-3.5 mass %, in particular, 0.1-2.0 mass %.

A sputtering target material of the invention may also be composed of a quinary Ag base alloy formed by adding, to above Ag—P binary alloy components, three components of (a) group metallic element(s), (b) group metallic element(s) and (c) group metallic element(s) and alloying them. In this quinary Ag base alloy the addition ratio of (a) group metallic element(s) to be added can be each within a range of 0.01-2.0 mass %, preferably 0.05-1.75 mass %, in particular, 0.1-1.5 mass %; that of the (b) group metallic element(s) may be within a range of, for Au, 0.01-0.9 mass %, preferably 0.05-0.85 mass %, in particular, 0.1-0.8 mass %; for Pd, 0.01-5.0 mass %, preferably 0.05-3.5 mass %, in particular, 0.1-2.0 mass %; and for Pt, 0.01-0.9 mass %, preferably 0.05-0.85 mass %, in particular, 0.1-0.8 mass %; and that of (c) group metallic element(s) may be each within a range of 0.01-5.0 mass %, preferably 0.05-3.5 mass %, in particular, 0.1-2.0 mass %.

Those Ag base alloys according to the invention can be prepared by those per se known methods, for example, by adding P to Ag; or adding (a) group metallic element(s) to Ag and P; or (b) group metallic element(s) to Ag and P; or (c) group metallic element(s) to Ag and P; or (a) group metallic element(s) and (b) group metallic element(s) to Ag and P; or (a) group metallic element(s) and (c) group metallic element(s) to Ag and P; or (b) group metallic element(s) and (c) group metallic element(s) to Ag and P; or (a) group, (b) group and (c) group metallic elements to Ag and P, each in the amount as specified in the above; and melting them together in a suitable metal melting furnace such as gas oven, high frequency melting furnace or the like, at temperatures of about 1,000-about 1,200° C. The melting atmosphere may be that of air, or of an inert gas or in vaquo where necessary.

Ag, which is the main starting material, may be that which is marketed in such forms as granule, plate, block or the like, normally having purity of at least 99.95%, preferably at least 99.99%. Also as those additive elements of P, In, Sn, Zn, Au, Pd, Pt, Cu, Ni, Fe and Bi, those marketed in such forms as powder, granule, plate, block and the like can be used. Normally those having purity of at least 99.9%, preferably that of at least 99.95%, are conveniently used.

Thus, binary to quinary Ag base alloys containing in Ag, P, or P and (a) group metallic element(s), or P and (b) group metallic element(s), or P and (c) group metallic element(s), or P, (a) group metallic element(s) and (b) group metallic element(s), or P, (a) group metallic element(s) and (c) group metallic element(s), or P, (b) group metallic element(s) and (c) group metallic element(s), or P, (a) group metallic element(s), (b) group metallic element(s) and (c) group metallic element(s), each at the respectively specified ratios. Sputtering target materials composed of those Ag base alloys maintain the high reflectance inherent in Ag and still in addition have drastically improved heat resistance over that of conventional Ag.

The sputtering target materials composed of the Ag base alloys according to the present invention, therefore, can be advantageously used for reflection coatings of optical disc media represented by CD and DVD for which high reflectance is required, and also for photo-reflective thin films in reflection type STN liquid crystal display devices or organic EL display devices.

Also for their use in those optical disc media represented by CD or DVD and reflection type STN liquid crystal display or organic EL display devices, corrosion resistance is required under their using conditions.

Ag—P binary alloys exhibit approximately equivalent sulfurization resistance or corrosion resistance to halogen elements to those of Ag. Whereas, it has been confirmed through experiments that addition of the (a) group metallic element and/or (b) group metallic element improves the corrosion resistance to exceed that of Ag.

Formulation of reflection coating from those sputtering target materials composed of Ag base alloys of the present invention can be conducted by any of sputtering methods known per se, for example, radiofrequency (RF) sputtering method, direct current (DC) sputtering method, magnetron sputtering method and the like.

Hereinafter the present invention is explained more specifically, referring to working examples.

EXAMPLES 1-1 TO 1-14 AND COMPARATIVE EXAMPLES 1-1 TO 1-3

To Ag and P, optionally at least one of In, Sn, Zn, Au, Pd, Pt, Cu, Ni, Fe and Bi was added, melted together in a gas oven at a temperature of about 1200° C., and the resulting melts were cast-processed to prepare sputtering target materials each having the composition as shown in Table 1. Also from those compositions of Comparative Examples, sputtering target materials were prepared in the similar manner.

TABLE 1

|  | Sample No. | Composition |
|---|---|---|
| Example | 1-1 | Ag-0.008 mass % P |
|  | 1-2 | Ag-0.13 mass % P |
|  | 1-3 | Ag-0.07 mass % P-0.40 mass % Cu |
|  | 1-4 | Ag-0.15 mass % P-0.85 mass % Cu |
|  | 1-5 | Ag-0.30 mass % P-1.70 mass % Cu |
|  | 1-6 | Ag-0.12 mass % P-0.80 mass % Zn |
|  | 1-7 | Ag-0.05 mass % P-0.80 mass % In |
|  | 1-8 | Ag-0.15 mass % P-0.85 mass % Cu-0.15 mass % Au |
|  | 1-9 | Ag-0.15 mass % P-0.85 mass % Cu-0.15 mass % Pd |
|  | 1-10 | Ag-0.11 mass % P-0.05 mass % Ni |
|  | 1-11 | Ag-0.04 mass % P-0.2 mass % In-0.8 mass % Pd |
|  | 1-12 | Ag-0.15 mass % P-0.5 mass % In-0.2 mass % Pd-0.85 mass % Cu |
|  | 1-13 | Ag-0.15 mass % P-0.85 mass % Cu-0.4 mass % Bi |
|  | 1-14 | Ag-0.15 mass % P-0.85 mass % Cu-0.05 mass % Fe |
| Comparative Example | 1-1 | Ag |
|  | 1-2 | Ag-0.5 mass % Au |
|  | 1-3 | Ag-1.0 mass % Zn |

For heat resistance examination, those sputtering target materials of the compositions as given in Table 1 were used to each form a thin film on a glass substrate plate to a film thickness of 150 nm by radiofrequency (RF) sputtering method, and heat resistance of the formed film was examined.

The examination method was as follows: after measuring reflectance of the film, the film was heat-treated at 200° C. in the air for an hour and its reflectance was measured once again. The variation ratio in the reflectance before and after the heat treatment was calculated according to the following equation:

variation ratio (%)=100−(reflectance after the test/reflectance before the test×100).

The results were as shown in Table 2.

TABLE 2

|  |  | Variation Ratio in Reflectance (%) | |
|---|---|---|---|
|  | Sample No. | Measuring wavelength 400 nm | Measuring wavelength 700 nm |
| Example | 1-1 | 1.4 | 0.0 |
|  | 1-2 | 0.0 | 0.0 |
|  | 1-3 | 0.0 | 0.0 |
|  | 1-4 | 0.0 | 0.0 |
|  | 1-5 | 0.0 | 0.0 |
|  | 1-6 | 0.0 | 0.0 |
|  | 1-7 | 1.2 | 0.0 |
|  | 1-8 | 0.0 | 0.0 |
|  | 1-9 | 0.0 | 0.0 |
|  | 1-10 | 0.0 | 0.0 |
|  | 1-11 | 0.6 | 0.0 |
|  | 1-12 | 0.0 | 0.0 |
|  | 1-13 | 0.0 | 0.0 |
|  | 1-14 | 0.0 | 0.0 |
| Comparative Example | 1-1 | 5.2 | 0.5 |
|  | 1-2 | 4.2 | 0.1 |
|  | 1-3 | 3.2 | 0.1 |

As seen in Table 2, where the measuring wavelength was 700 nm very little difference was observed in variation ratio in reflectance of measured samples, but when the measuring wavelength was 400 nm, reflectance dropped in Comparative Examples 1-1 to 1-3. By contrast, there was nearly no decrease in reflectance in Examples 1-1 to 1-14, and it can be understood that the products of the invention excel in heat resistance.

For further investigating heat resistance, those thin films prepared in identical manner with the above were heat treated in the air at 250° C. for an hour and the variation ratio in their reflectance was determined in the identical manner. The results were as shown in Table 3.

TABLE 3

|  |  | Variation Ratio in Reflectance (%) | |
|---|---|---|---|
|  | Sample No. | Measuring wavelength 400 nm | Measuring wavelength 700 nm |
| Example | 1-1 | 3.8 | 0.0 |
|  | 1-2 | 1.2 | 0.0 |
|  | 1-3 | 0.1 | 0.0 |
|  | 1-4 | 0.0 | 0.0 |
|  | 1-5 | 0.0 | 0.0 |
|  | 1-6 | 0.6 | 0.0 |
|  | 1-7 | 3.2 | 0.0 |
|  | 1-8 | 0.0 | 0.0 |
|  | 1-9 | 0.0 | 0.0 |
|  | 1-10 | 0.1 | 0.0 |
|  | 1-11 | 1.5 | 0.0 |
|  | 1-12 | 0.0 | 0.0 |
|  | 1-13 | 0.0 | 0.0 |
|  | 1-14 | 0.0 | 0.0 |
| Comparative Example | 1-1 | 16.0 | 1.0 |
|  | 1-2 | 6.9 | 0.1 |
|  | 1-3 | 5.3 | 0.0 |

As seen in Table 3, where the measuring wavelength was 700 nm, very little difference was observed in variation ratio in reflectance of measured samples, but when the measuring wavelength was 400 nm, decrease in reflectance of those thin films of Examples 1-1 to 1-14 was suppressed compared with that in the thin films of Comparative Examples 1-1 to 1-3. Thus it can be understood that the films of the invention are by far superior in heat resistance.

EXAMPLES 2-1 TO 2-5 AND COMPARATIVE EXAMPLES 2-1 TO 2-2

Under actual use conditions, improvement in corrosion resistance, in particular, sulfurization resistance, is occasionally required. Hence, sputtering target materials of the compositions as shown in the following Table 4 were prepared in the identical manner with the foregoing Examples, and their sulfurization resistance was examined.

The examination method was as follows. Using those sputtering target materials, films were formed on glass substrate plates to a thickness of 150 nm by radio frequency (RF) sputtering method. After measuring reflectance of the films, the films were immersed in 0.01% aqueous solution of sodium sulfide ($Na_2S$) for an hour and thereafter their reflectance was measured once again. The variation ratio in reflectance of the thin films before and after the immersion was calculated according to the following equation:

variation ratio (%)=100−(reflectance after the test/ reflectance before the test×100).

The results were as shown in Table 5.

TABLE 4

|  | Sample No. | Composition |
|---|---|---|
| Example | 2-1 | Ag-0.12 mass % P-0.80 mass % Zn |
|  | 2-2 | Ag-0.05 mass % P-0.80 mass % In |
|  | 2-3 | Ag-0.05 mass % P-0.80 mass % In |
|  | 2-4 | Ag-0.04 mass % P-0.2 mass % In-0.8 mass % Pd |
|  | 2-5 | Ag-0.15 mass % P-0.5 mass % In-0.2 mass % Pd-0.85 mass % Cu |
| Comparative Example | 2-1 | Ag |
|  | 2-2 | Ag-0.5 mass % Au |

TABLE 5

|  | Sample No. | Variation Ratio in Reflectance (%) After the test | |
|---|---|---|---|
|  |  | Measuring wavelength 400 nm | Measuring wavelength 700 nm |
| Example | 2-1 | 46 | 18 |
|  | 2-2 | 44 | 18 |
|  | 2-3 | 45 | 18 |
|  | 2-4 | 45 | 16 |
|  | 2-5 | 41 | 17 |
| Comparative Example | 2-1 | 61 | 38 |
|  | 2-2 | 61 | 35 |

It can be understood from Table 5 that decrease in reflectance was suppressed in the thin films of Examples 2-1 to 2-5 in which In, Sn, Zn, etc. were added, compared with that in the films of Comparative Examples 2-1 to 2-2, and the products according to the invention excel in sulfurization resistance.

EXAMPLES 3-1 TO 3-2 AND COMPARATIVE EXAMPLE 3-1

Under actual using environments, improvement in chlorine resistance may also be required, and examination of chlorine resistance was conducted.

The examination method was as follows. Sputtering target materials of the compositions as specified in Table 6 were prepared, which were then used to form films on glass substrate plates to a thickness of 150 nm by radiofrequency (RF) sputtering method. The films were measured of their reflectance, immersed in 3% aqueous solution of sodium chloride (NaCl) for 10 minutes, and measured of reflectance once again. The variation ratio in the reflectance of the thin films before and after the immersion was calculated according to the following equation:

variation ratio (%)=100−(reflectance after the test/ reflectance before the test×100).

The results were as shown in Table 7.

TABLE 6

|  | Sample No. | Composition |
|---|---|---|
| Example | 3-1 | Ag-0.15 mass % P-0.85 mass % Cu-0.15 mass % Au |
|  | 3-2 | Ag-0.15 mass % P-0.85 mass % Cu-0.15 mass % Pd |
| Comparative Example | 3-1 | Ag |

TABLE 7

|  | Sample No. | Variation Ratio in Reflectance (%) After the test | |
|---|---|---|---|
|  |  | Measuring wavelength 400 nm | Measuring wavelength 700 nm |
| Example | 3-1 | 0.4 | 0.0 |
|  | 3-2 | 0.3 | 0.0 |
| Comparative Example | 3-1 | 3.4 | 0.0 |

It can be understood from Table 7 that decrease in reflectance was suppressed in the thin films of Examples 3-1 to 3-2 in which Au, Pd, etc. were added, compared with that in the film of Comparative Example 3-1, and that the products according to the invention excel in chlorine resistance.

The invention claimed is:

1. A sputtering target material for forming a thin film having high reflectance, said material being an Ag base alloy consisting of Ag having a purity of at least 99.95%, 0.008-1.0 mass % of P, 0.01-0.9 mass % of Au, and 0.01-2.0 mass % of at least one metallic element selected from Cu and Bi, wherein P, Au, Cu and Bi have a purity of at least 99.9%.

2. A thin film formed from the material of claim 1.

* * * * *